United States Patent
Arai et al.

(10) Patent No.: US 11,552,626 B2
(45) Date of Patent: Jan. 10, 2023

(54) HIGH SPEED SIGNAL ADJUSTMENT CIRCUIT

(71) Applicant: MICRON TECHNOLOGY, INC., Boise, ID (US)

(72) Inventors: Tetsuya Arai, Sagamihara (JP); Junki Taniguchi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/396,516

(22) Filed: Aug. 6, 2021

(65) Prior Publication Data

US 2021/0367587 A1 Nov. 25, 2021

Related U.S. Application Data

(63) Continuation of application No. 16/358,568, filed on Mar. 19, 2019, now Pat. No. 11,088,681.

(51) Int. Cl.
| | |
|---|---|
| *H03K 5/135* | (2006.01) |
| *H03K 3/037* | (2006.01) |
| *G11C 7/10* | (2006.01) |
| *H03K 17/687* | (2006.01) |
| *H03M 9/00* | (2006.01) |

(52) U.S. Cl.
CPC ........... *H03K 5/135* (2013.01); *G11C 7/1057* (2013.01); *H03K 3/037* (2013.01); *H03K 17/6872* (2013.01); *H03M 9/00* (2013.01)

(58) Field of Classification Search
CPC ........ H03K 5/1565; H03K 7/08; H03K 3/017; H03K 5/151; H03L 7/0812
USPC ........................................................... 327/175
See application file for complete search history.

(56) References Cited

U.S. PATENT DOCUMENTS

| | | | | |
|---|---|---|---|---|
| 6,288,563 | B1* | 9/2001 | Muljono | H03K 19/0005 326/27 |
| 8,004,328 | B2* | 8/2011 | Kim | H03L 7/07 327/158 |
| 9,178,563 | B2 | 11/2015 | Ren et al. | |
| 9,667,252 | B1* | 5/2017 | Lee | H03K 5/1565 |
| 2002/0079940 | A1 | 6/2002 | Boerstler et al. | |
| 2005/0024243 | A1* | 2/2005 | Kim | H03M 9/00 341/101 |
| 2007/0234158 | A1* | 10/2007 | Shin | G11C 29/1201 714/731 |

(Continued)

FOREIGN PATENT DOCUMENTS

KR  20150129424 A  * 11/2015  ........... G11C 7/1054

*Primary Examiner* — Quan Tra
(74) *Attorney, Agent, or Firm* — Dorsey & Whitney LLP

(57) ABSTRACT

Disclosed herein is an apparatus that includes a data serializer including a plurality of first buffer circuits configured to receive a plurality of data, respectively, and a second buffer circuit configured to serialize the plurality of data provided from the plurality of first buffer circuits. At least one of the plurality of first buffer circuits and the second buffer circuit includes: a first circuit configured to drive a first signal node to one of first and second logic levels based on an input signal, the first circuit including a first adjustment circuit configured to adjust a driving capability of the first circuit when the first circuit drives the first signal node to the first logic level; and a second circuit configured to drive the first signal node to other of the first and second logic levels.

18 Claims, 12 Drawing Sheets

(56) References Cited

U.S. PATENT DOCUMENTS

| | | | |
|---|---|---|---|
| 2010/0117702 A1* | 5/2010 | Jang | H03L 7/0814 |
| | | | 327/175 |
| 2013/0176064 A1 | 7/2013 | Lu | |
| 2015/0222254 A1 | 8/2015 | Walker | |
| 2017/0324540 A1 | 11/2017 | Jung | |
| 2018/0234096 A1* | 8/2018 | Li | H03F 3/082 |
| 2020/0304114 A1 | 9/2020 | Arai et al. | |

* cited by examiner

Up 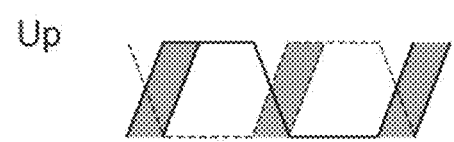 Up 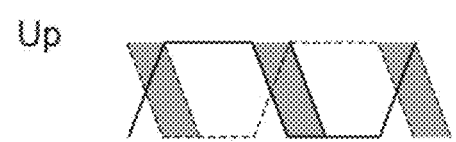
Down 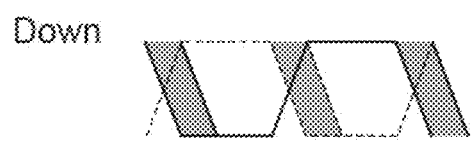 Down 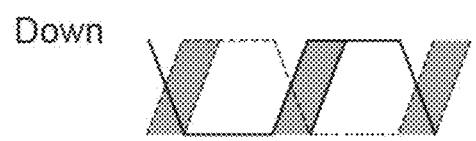
 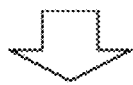
Out 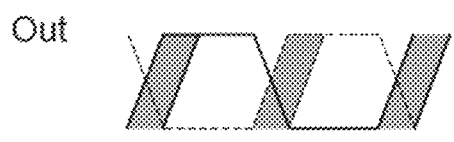 Out 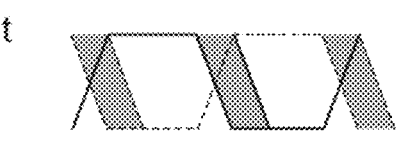
FIG. 14A					FIG. 14B

HIGH SPEED SIGNAL ADJUSTMENT CIRCUIT

CROSS-REFERENCE TO RELATED APPLICATION

This application is a continuation of U.S. patent application Ser. No. 16/358,568, filed Mar. 19, 2019, issued as U.S. Pat. No. 11,088,681 on Aug. 10, 2021. This application and patent are incorporated by reference herein in their entirety and for all purposes.

BACKGROUND

The change of timing of a signal on a high speed signal path can be delayed by adjusting the current supply capability of a driver inserted into the signal path. However, when the current supply capability of a driver is lowered, a signal output from the driver may not fully oscillate, which leads to jitter. Therefore, there has been demanded a circuit that can realize full oscillation even if the current supply capability of a driver inserted into a high speed signal path is adjusted.

BRIEF DESCRIPTION OF THE DRAWINGS

FIG. 14A and FIG. 14B are waveform diagrams respectively showing signal waveforms on a serializer shown in FIG. 13.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
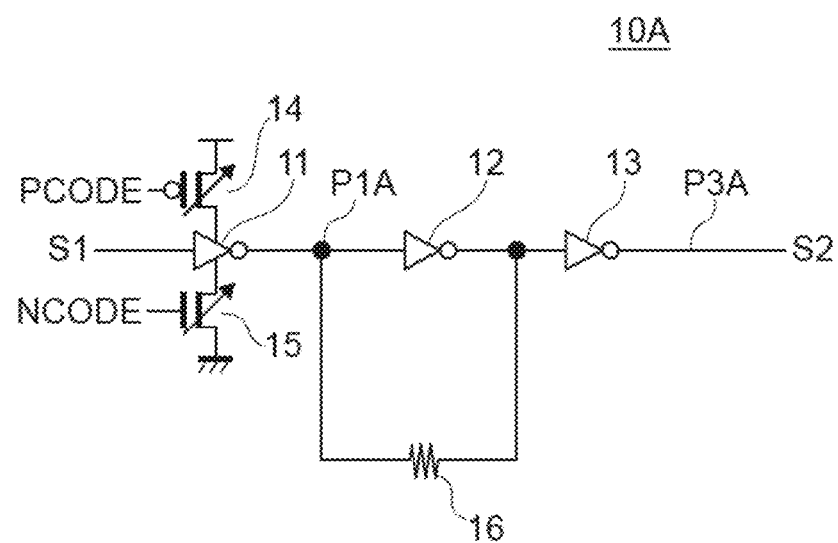
FIG. 1 is a circuit diagram showing an example of a signal path according to the present disclosure.
Figure 2:
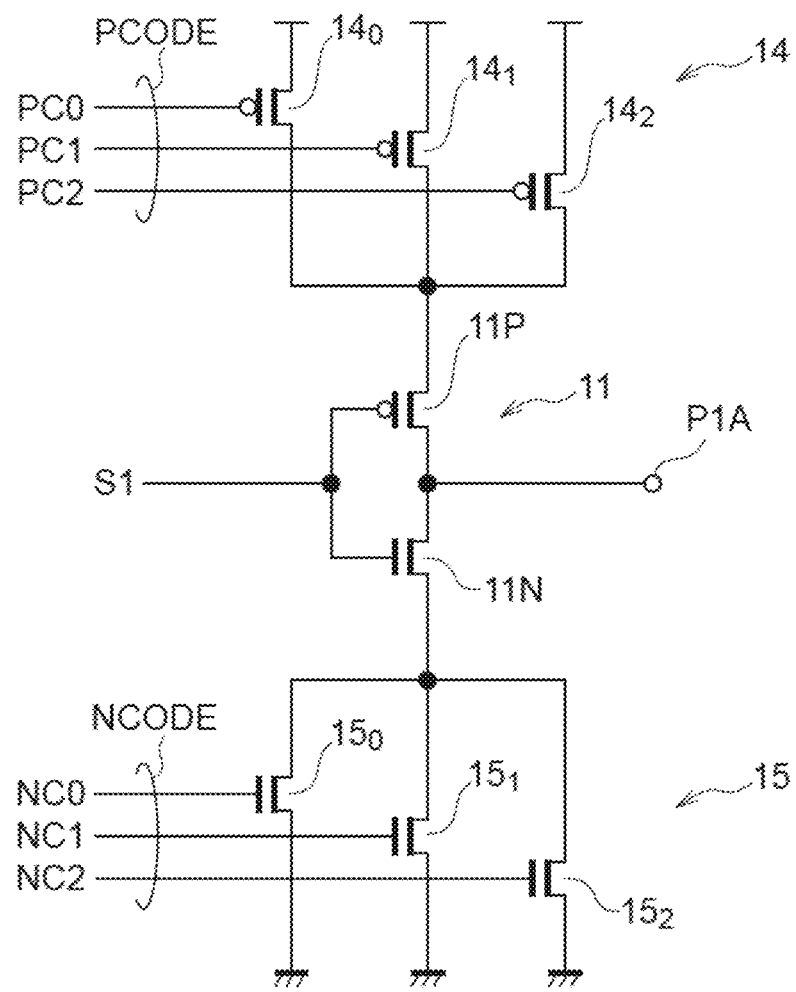
FIG. 2 is a circuit diagram more specifically showing an inverter circuit and an adjustment circuit shown in FIG. 1.

A signal path 10A shown in FIG. 1 includes three inverter circuits 11, 12, and 13 cascade-connected in this order. A signal S1 is input to the inverter circuit 11 at the first stage and a signal S2 is output from the inverter circuit 13 at the last stage. The inverter circuit 11 includes an adjustment circuit 14 that adjusts the pull-up capability of a signal node P1A and an adjustment circuit 15 that adjusts the pull-down capability of the signal node P1A. The adjustment circuit 14 adjusts the amount of a current flowing from a power line supplied with a power potential to the inverter circuit 11 on the basis of a code signal PCODE. The adjustment circuit 15 adjusts the amount of a current flowing from the inverter circuit 11 to a power line supplied with a ground potential on the basis of a code signal NCODE. As shown in FIG. 2, the adjustment circuit 14 includes a plurality of P-channel MOS transistors $14_0$ to $14_2$ connected in parallel. Bits PC0 to PC2 constituting the code signal PCODE are supplied to gate electrodes of the transistors $14_0$ to $14_2$, respectively. The adjustment circuit 15 includes a plurality of N-channel MOS transistors $15_0$ to $15_2$ connected in parallel. Bits NC0 to NC2 constituting the code signal NCODE are supplied to gate electrodes of the transistors $15_0$ to $15_2$, respectively. The respective numbers of bits of the code signals PCODE and NCODE are not particularly limited to any specific number. The current supply capabilities of the transistors included in each of the adjustment circuits 14 and 15 can be different from one another. The inverter circuit 11 includes a P-channel MOS transistor 11P having a source connected to the adjustment circuit 14, and an N-channel MOS transistor 11N having a source connected to the adjustment circuit 15.

The inverter circuit 12 has an input node and an output node short-circuited via a resistor circuit 16. Accordingly, the inverter circuit 12 and the resistor circuit 16 constitute a de-emphasis circuit and restrict the maximum amplitude of the node P1A. For example, when the signal S1 is at a high level, the transistor 11N included in the inverter circuit 11 is turned on and accordingly the node P1A has a low level. However, because an output at a high level is provided to the node P1A from the inverter circuit 12 via the resistor circuit 16, the level of the node P1A becomes a predetermined level determined by the on-resistances of the transistor 11N and the adjustment circuit 15, and the ratio between the on-resistance of the inverter circuit 12 and the resistance value of the resistor circuit 16. The same holds true for a case where the signal S1 is at a low level and the level of the node P1A becomes a predetermined level determined by the on-resistances of the transistor 11P and the adjustment circuit 14, and the ratio between the on-resistance of the inverter circuit 12 and the resistance value of the resistor circuit 16. Therefore, even in a case where the current supply capability of the adjustment circuit 14 or the adjustment circuit 15 is set to the minimum value, only the amplitude changes and a signal appearing on the node NA always fully oscillates. Accordingly, even if the value of the code signal PCODE or NCODE is changed, no jitter occurs.

Figure 3:
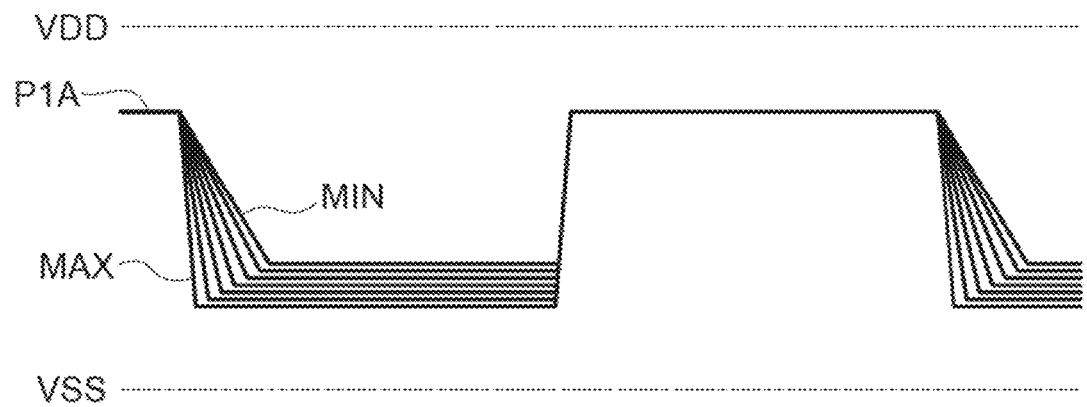
FIG. 3 and FIG. 4 are waveform diagrams respectively showing signal waveforms on the signal path shown in FIG. 1.
Figure 4:
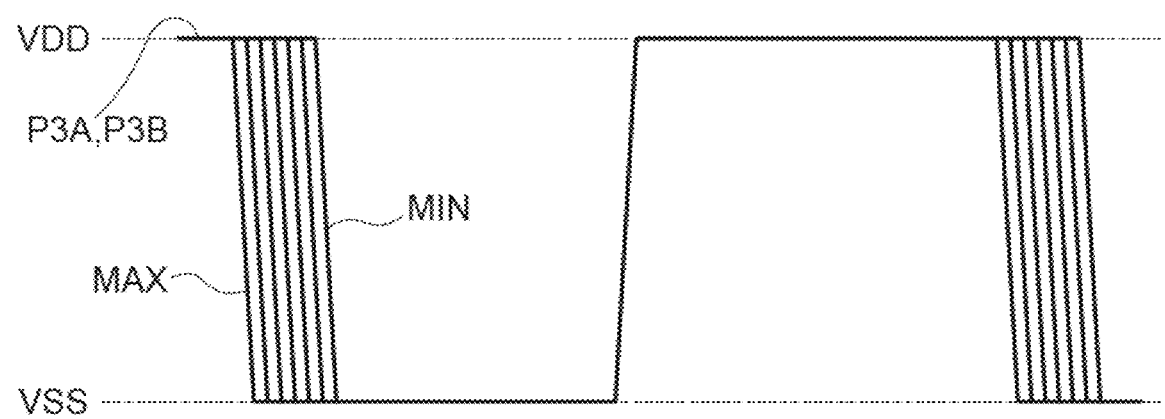

FIG. 3 shows waveforms of the signal appearing on the node HA when the code signal NCODE is changed in the signal path 10A. First, when the code signal NCODE is set to the maximum value and the transistors $15_0$ to $15_2$ are all turned on, the change speed at which the level of the node HA changes from a high level to a low level becomes highest as indicated by a waveform MAX. When the value of the code signal NCODE is then gradually reduced, the current supply capability of the adjustment circuit 15 gradually lowers. Therefore, the speed at which the level of the node HA changes from a high level to a low level gradually reduces and the amplitude decreases. When the code signal NCODE is set to the minimum value, the change speed at which the level of the node HA changes from a high level to a low level becomes lowest as indicated by a waveform MIN. Accordingly, the timing when the signal S2 appearing on a node P3A falls can be adjusted by the value of the code signal NCODE as shown in FIG. 4. Similarly, the timing when the signal S2 rises can be adjusted by the value of the code signal PCODE.

Figure 5:
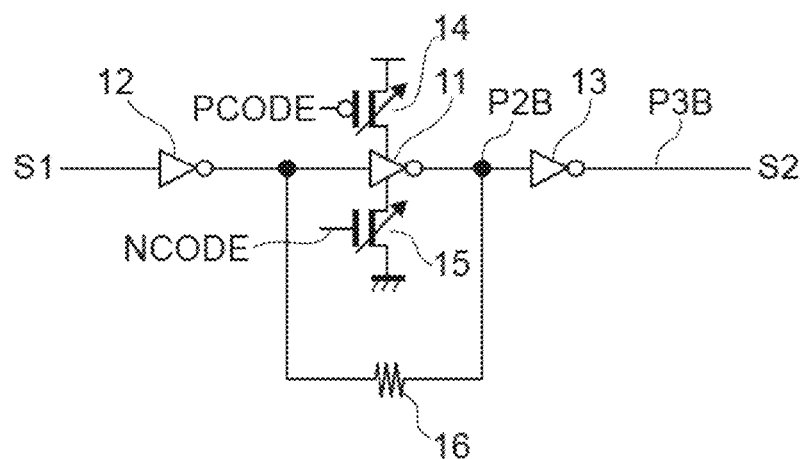
FIG. 5 is a circuit diagram showing another example of the signal path according to the present disclosure.

A signal path 10B shown in FIG. 5 includes the three inverter circuits 12, 11, and 13 cascade-connected in this order. The signal S1 is input to the inverter circuit 12 at the first stage and the signal S2 is output from the inverter circuit 13 at the last stage. In the signal path 10B, an input node and an output node of the inverter circuit 11 are short-circuited via the resistor circuit 16. Accordingly, the inverter circuit 11 and the resistor circuit 16 constitute a de-emphasis circuit and restrict the maximum amplitude of a node P2B. For example, when the signal S1 is at a high level, the transistor 11P included in the inverter circuit 11 is turned on and accordingly the node P2B becomes a high level. However, because a low-level output is provided to the node P2B from the inverter circuit 12 via the resistor circuit 16, the level of the node P2B becomes a predetermined level determined by the on-resistances of the transistor 11P and the adjustment circuit 14, and the ratio between the on-resistance of the inverter circuit 12 and the resistance value of the resistor circuit 16. The same holds true for a case where the signal S1 is at a low level and the level of the node P2B becomes a predetermined level determined by the on-resistance of the transistor 11N and the adjustment circuit 15, and the ratio between the on-resistance of the inverter circuit 12 and the resistance value of the resistor circuit 16. Therefore, even in a case where the current supply capability of the adjustment circuit 14 or the adjustment circuit 15 is set to the minimum value, only the amplitude changes and a signal appearing on the node P2B always fully oscillates. Accordingly, even if the value of the code signal PCODE or NCODE is changed, no jitter occurs.

Figure 6:
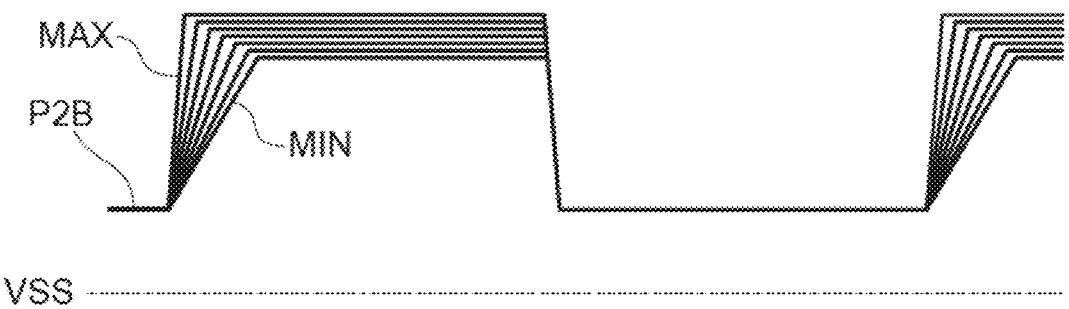
FIG. 6 is a waveform diagram showing signal waveforms on the signal path shown in FIG. 5.

FIG. 6 shows waveforms of the signal appearing on the node P2B when the code signal PCODE is changed in the signal path 10B. First, when the code signal PCODE is set to the maximum value and the transistors $14_0$ to $14_2$ are all turned on, the change speed at which the level of the node P2B changes from a low level to a high level becomes highest as indicated by a waveform MAX. When the value of the code signal PCODE is gradually reduced, the current supply capability of the adjustment circuit 14 gradually lowers. Therefore, the speed at which the level of the node P2B changes from a low level to a high level gradually reduces and the amplitude decreases. When the code signal PCODE is set to the minimum value, the change speed at which the level of the node P2B changes from a low level to a high level becomes lowest as indicated by a waveform MIN. Accordingly, the timing when the signal S2 appearing on the node P3B falls can be adjusted by the value of the code signal PCODE as shown in FIG. 4. Similarly, the timing when the signal S2 rises can be adjusted by the value of the code signal NCODE.

Figure 7:
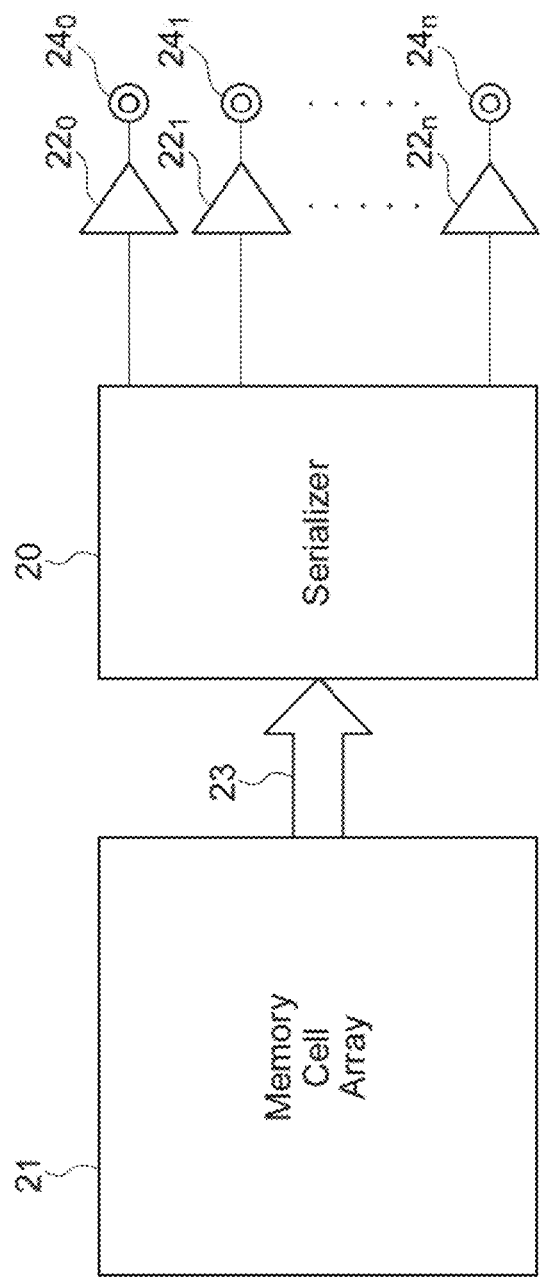
FIG. 7 is a block diagram for explaining connection points of a serializer.

The signal paths 10A and 10B described above can be used as a high speed signal path included in a serializer. As shown in FIG. 7, a serializer 20 can be placed between a memory cell array 21 and output buffer circuits 22. In this case, parallel read data 23 output from the memory cell array 21 is converted by the serializer 20 into serial data and is supplied to the output buffer circuits 22. In the example shown in FIG. 7, a plurality of data terminals $24_0$ to $24_n$ are provided and a plurality of output buffer circuits $22_0$ to $22_n$ are provided correspondingly. In this case, while an input path of the serializer 20 is a relatively-low speed signal path, an output path of the serializer 20 is a high speed signal path.

Figure 8:
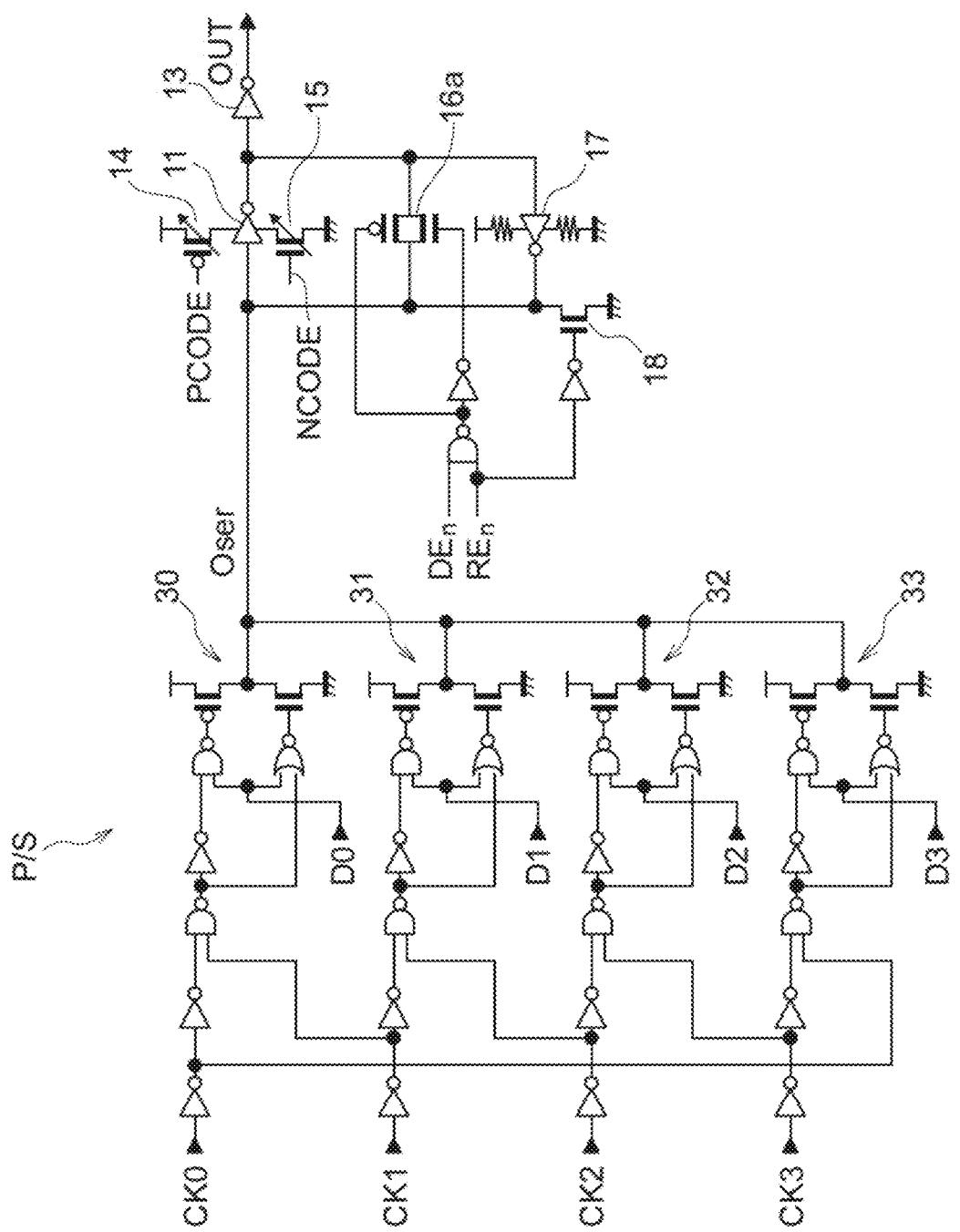
FIG. 8 is a circuit diagram showing an example in which the signal path shown in FIG. 5 is applied to a serializer.
Figure 9:
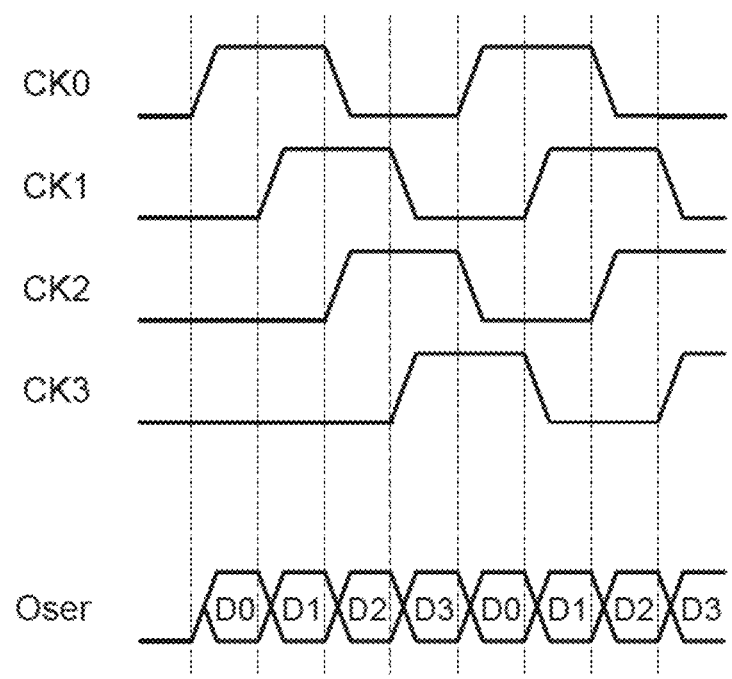
FIG. 9 is a waveform diagram showing signal waveforms on the serializer shown in FIG. 8.

FIG. 8 shows a parallel/serial conversion circuit P/S that converts parallel read data D0 to D3 into serial data, and the inverter circuits 11 and 13 connected at the subsequent stage. The parallel serial conversion circuit P/S includes four tristate buffer circuits 30 to 33. One of the tristate buffer circuits 30 to 33 is activated and outputs of the remaining three tristate buffer circuits become a high impedance state on the basis of clock signals CK0 to CK3. The clock signals CK0 to CK3 are four-phase clock signals having phases different from one another by 90 degrees as shown in FIG. 9. The tristate buffer circuits 30 to 33 output the read data D0 to D3 to a signal node Oser in response to rising edges of the clock signals CK0 to CK3, respectively. Therefore, the frequency of the serial read data D0 to D3 appearing on the signal node Oser is twice as high as the frequency of the parallel read data D0 to D3 input to the parallel/serial conversion circuit P/S.

The parallel/serial conversion circuit P/S and the inverter circuits 11 and 13 connected at the subsequent stage correspond to the signal path 10B shown in FIG. 5. In the circuit shown in FIG. 8, the resistor circuit 16 shown in FIG. 5 is replaced by a transfer gate 16a. Further, an inverter circuit 17 having a significantly small driving capability and a transistor 18 that resets the signal node Oser to a low level are added. The transistor 18 is turned off during a period when a read enable signal $RE_n$ is activated to a high level and is turned on during a period when the read enable signal $RE_n$ is deactivated to a low level. When the transistor 18 is turned on, the signal node Oser is fixed to a low level. When the read enable signal $RE_n$ is activated, the transistor 18 is turned off and the read data D0 to D3 appearing on the signal node Oser is output via the inverter circuits 11 and 13. When a de-emphasis enable signal $DE_n$ has been activated to a high level at this time, the transfer gate 16a is turned on and accordingly the input node and the output node of the inverter circuit 11 are short-circuited via the transfer gate 16a. Therefore, the same function as that of the circuit shown in FIG. 5 can be realized. On the other hand, when the de-emphasis enable signal $DE_n$ has been deactivated to a low level, the transfer gate 16a is turned off and accordingly the de-emphasis operation is not performed. The de-emphasis enable signal $DE_n$ is activated when the frequency of the read data D0 to D3 appearing on the signal node Oser is high and is deactivated when the frequency of the read data D0 to D3 appearing on the signal node Oser is low. Accordingly, current consumption can be reduced when the frequency of the read data D0 to D3 is low.

Figure 10:
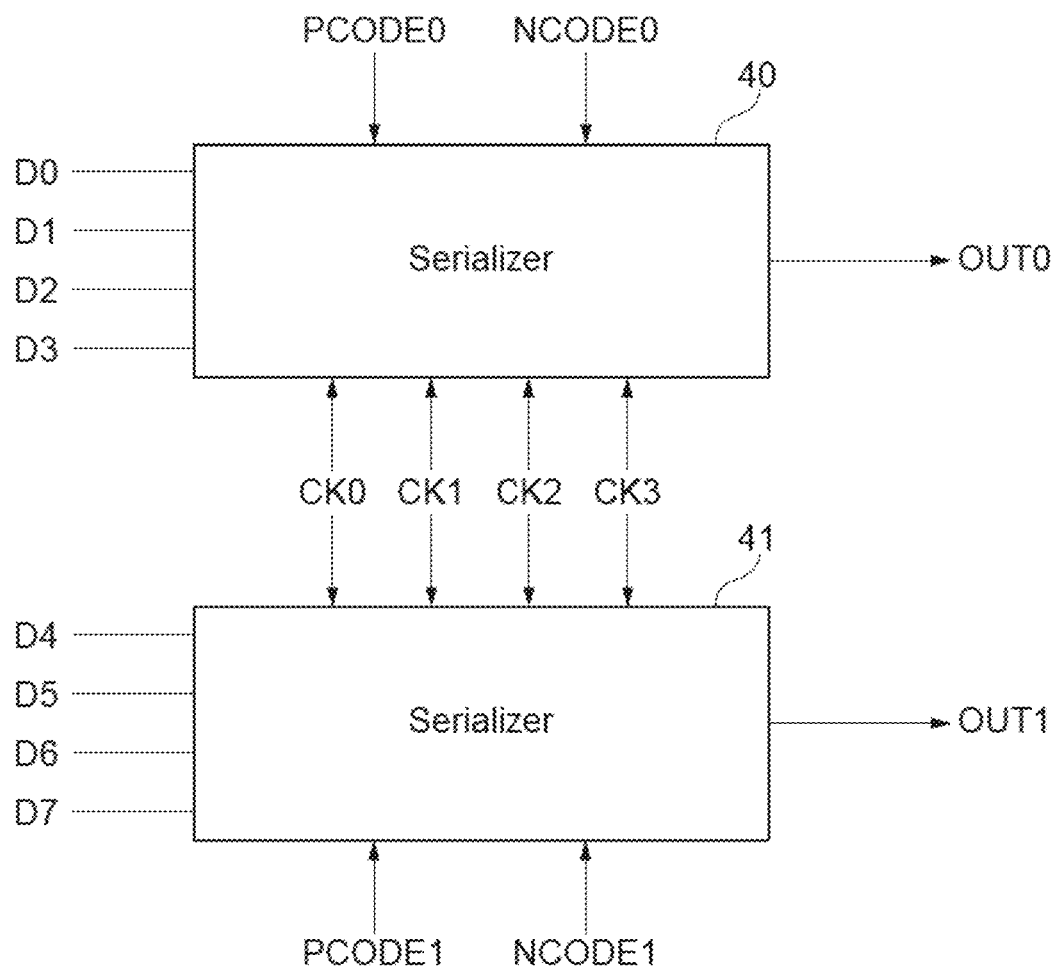
FIG. 10 is a block diagram showing two serializers.

Plural sets of the circuits shown in FIG. 8 can be included in the inside of the serializer 20 shown in FIG. 7. For example, two serializers 40 and 41 each having the same circuit configuration as that shown in FIG. 8 can be provided as shown in FIG. 10. Parallel read data D0 to D3 is input to the serializer 40 and different parallel read data D4 to D7 is input to the serializer 41. The clock signals CK0 to CK3 are common to the serializers 40 and 41. Code signals PCODE0 and NCODE0 are input to the serializer 40 and different code signals PCODE1 and NCODE1 are input to the serializer 41. When a plurality of the serializers 40 and 41 are used in parallel in this way, the delay amounts of output signals can be controlled independently using separate code signals, respectively.

Figure 11:
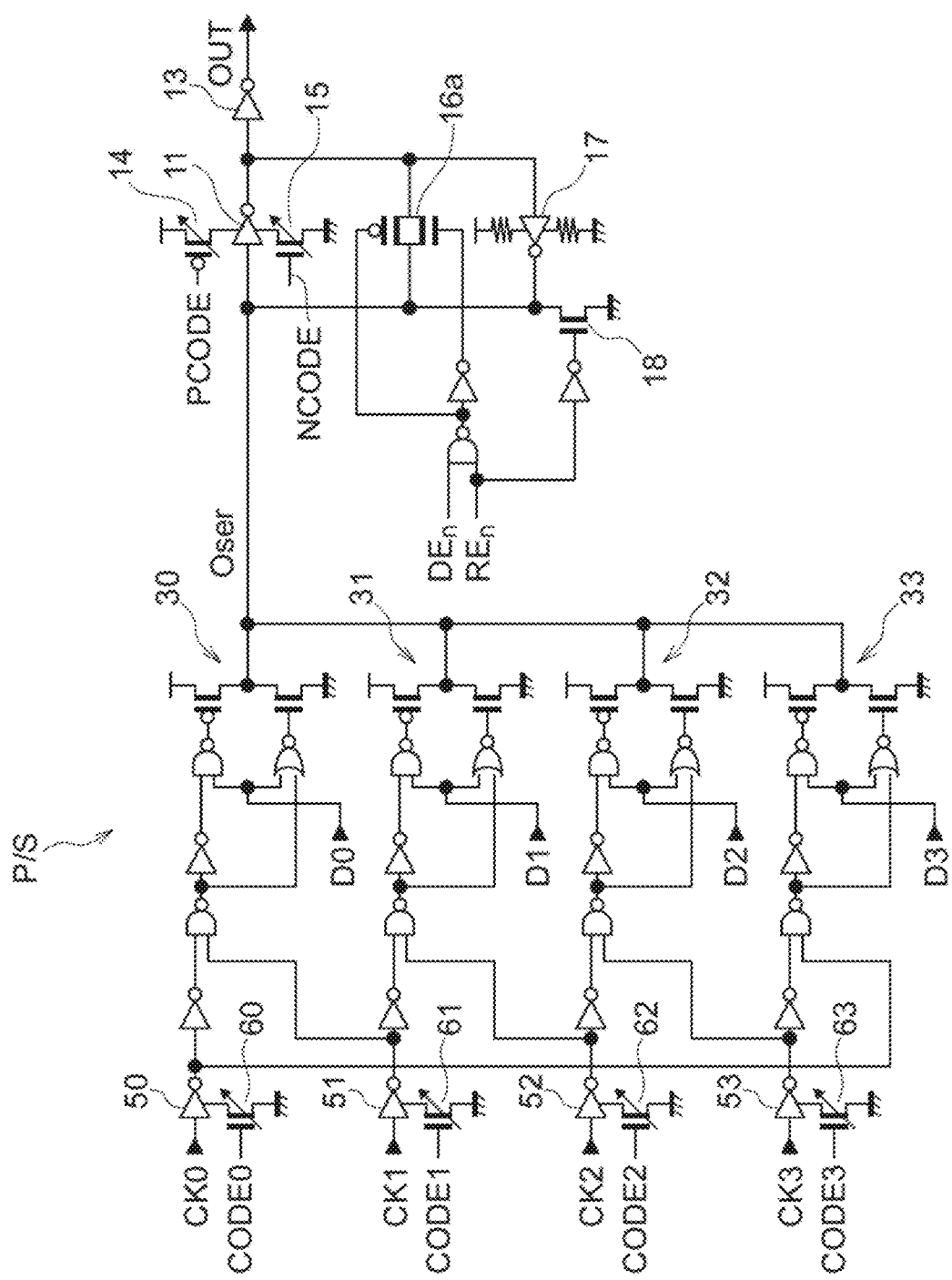
FIG. 11 is a circuit diagram showing another example in which the signal path shown in FIG. 5 is applied to a serializer.

The parallel/serial conversion circuit P/S shown in FIG. 11 is different from the parallel/serial conversion circuit P/S shown in FIG. 8 in that adjustment circuits 60 to 63 are provided in inverter circuits 50 to 53 that receive the clock signals CK0 to CK3, respectively. The adjustment circuits 60 to 63 are connected between the inverter circuits 50 to 53 and a power line supplied with the ground potential, respectively, and the current supply capabilities thereof are adjusted by code signals CODE0 to CODE3, respectively. Accordingly, even when the phases of the clock signals CK0 to CK3 input to the parallel/serial conversion circuit P/S are slightly deviated from setting values, the phases of the clock signals CK0 to CK3 output from the inverter circuits 50 to 53 can be caused to be different from one another accurately by 90 degrees.

Figure 12:
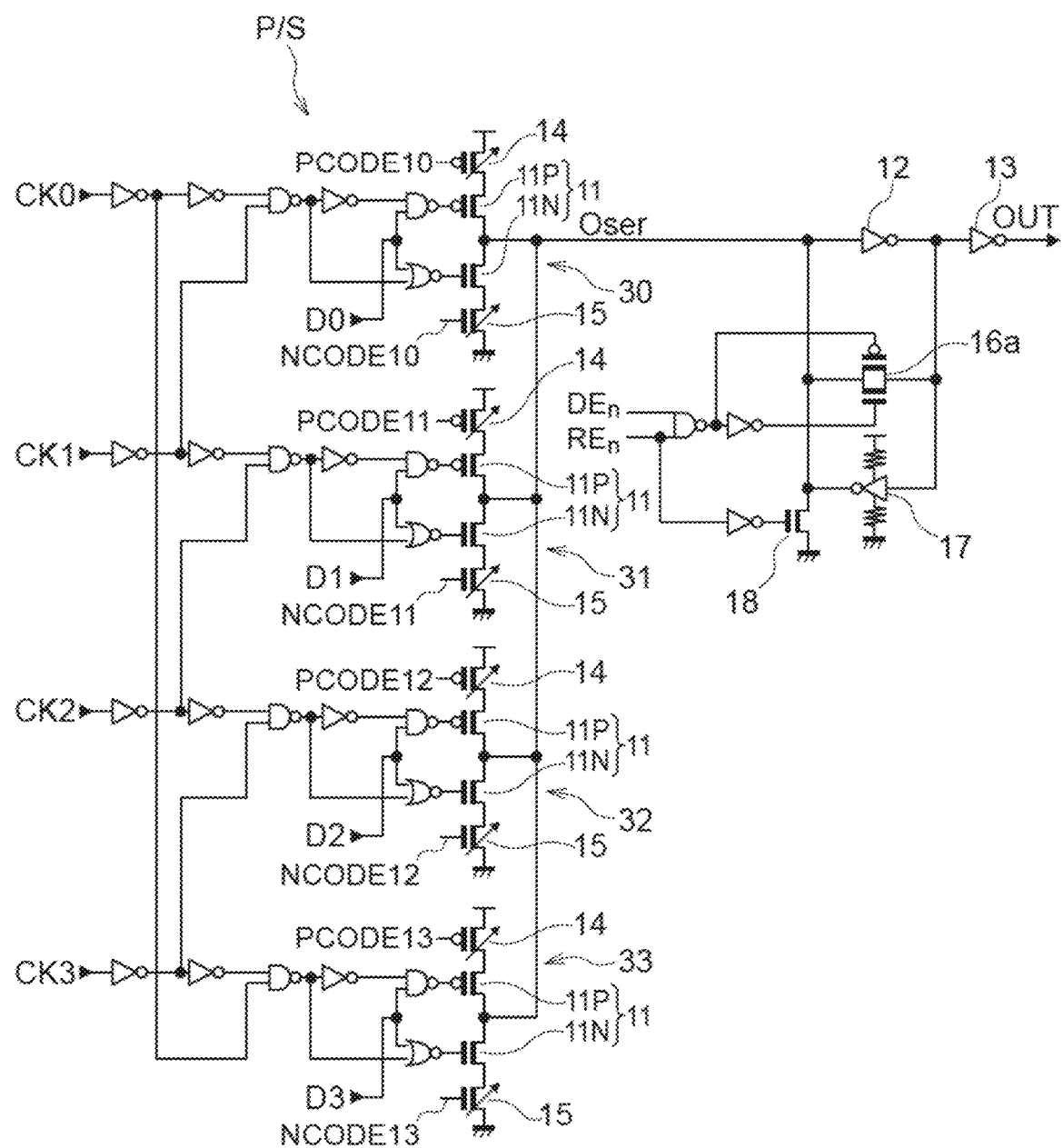
FIG. 12 is a circuit diagram showing an example in which the signal path shown in FIG. 1 is applied to a serializer.

The parallel/serial conversion circuit P/S shown in FIG. 12 has a configuration in which the adjustment circuits 14 and 15 are provided in each of the tristate buffer circuits 30 to 34 shown in FIG. 8. The inverter circuits 12 and 13 are connected in series at the subsequent stage of the signal node Oser. The input node and the output node of the inverter circuit 12 are short-circuited via the transfer gate 16a. The tristate buffer circuits 30 to 34 and the inverter circuits 12 and 13 connected at the subsequent stage correspond to the signal path 10A shown in FIG. 1. Code signals PCODE10 and NCODE10 are respectively supplied to the adjustment circuits 14 and 15 provided in the tristate buffer circuit 30, code signals PCODE11 and NCODE11 are respectively supplied to the adjustment circuits 14 and 15 provided in the tristate buffer circuit 31, code signals PCODE12 and NCODE12 are respectively supplied to the adjustment circuits 14 and 15 provided in the tristate buffer circuit 32, and code signals PCODE13 and NCODE13 are respectively supplied to the adjustment circuits 14 and 15 provided in the tristate buffer circuit 33. Also with this circuit configuration, the same function as that of the serializer shown in FIG. 11 can be realized.

Figure 13:
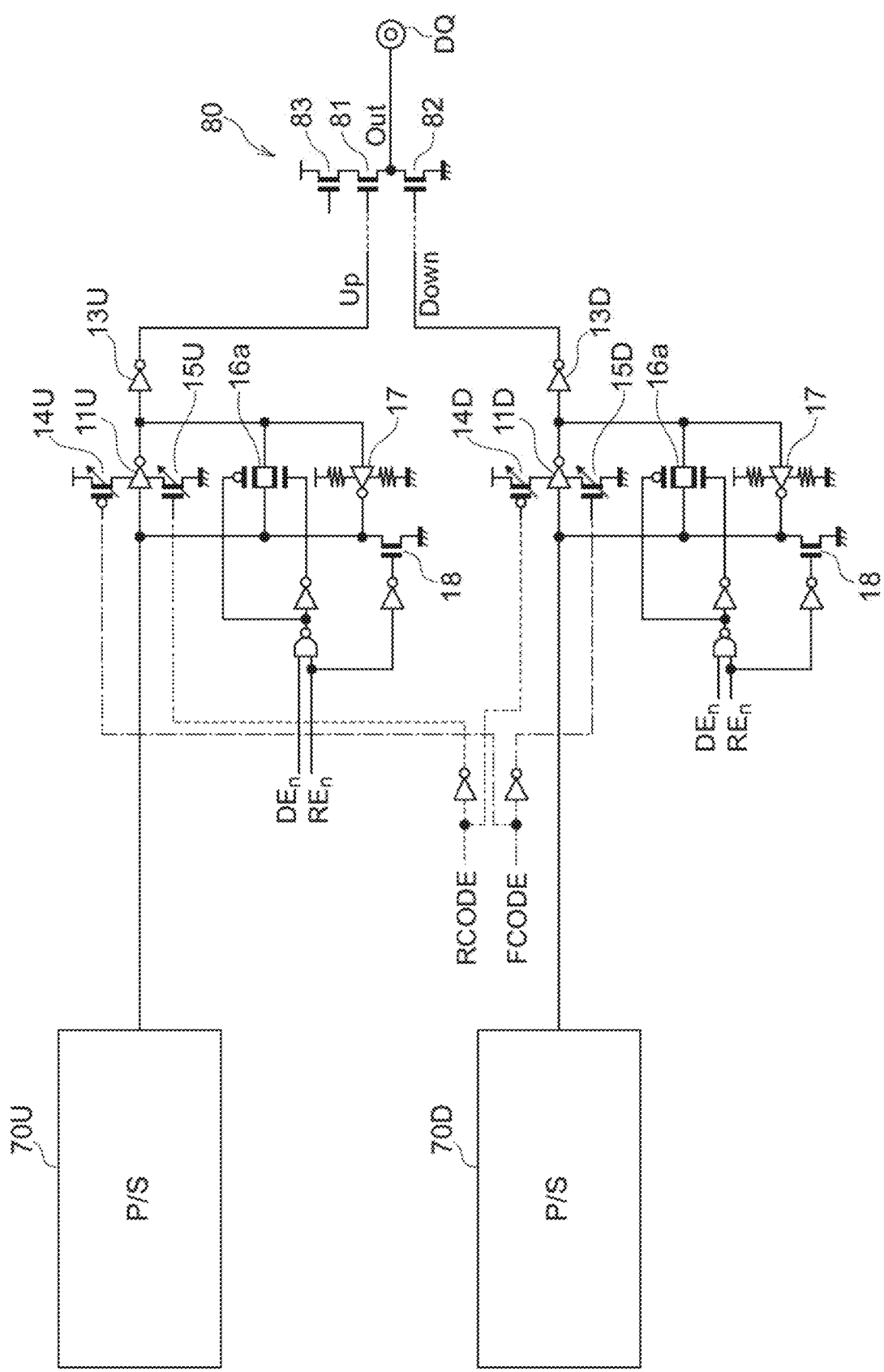
FIG. 13 is a circuit diagram showing an example in which a signal path for driving an output buffer circuit is divided into a pull-up signal path and a pull-down signal path.

As shown in FIG. 13, the parallel/serial conversion circuit P/S can be provided to each of a pull-up signal path and a pull-down signal path. In the example shown in FIG. 13, a pull-up signal Up output from a parallel/serial conversion circuit 70U is supplied to a gate electrode of a pull-up transistor 81 included in an output buffer circuit 80 via inverter circuits 11U and 13U, and a pull-down signal Down output from a parallel/serial conversion circuit 70D is supplied to a gate electrode of a pull-down transistor 82 included in the output buffer circuit 80 via inverter circuits 11D and 13D. The output buffer circuit 80 has a configuration in which a transistor 83, the transistors 81, and the transistor 82 are connected in series, and a data output terminal DQ is connected to a connection point between the transistors 81 and 82.

In this circuit configuration, a common code signal RCODE is supplied to an adjustment circuit 15U and an adjustment circuit 14D, and a common code signal FCODE is supplied to an adjustment circuit 14U and an adjustment circuit 15D. However, because polarities of the transistors in the adjustment circuit 15U and the adjustment circuit 14D are opposite to each other, the logic levels of a plurality of bits constituting the code signal RCODE are all inverted. Similarly, the polarities of the transistors in the adjustment circuit 14U and the adjustment circuit 15D are opposite to each other and therefore the logic levels of a plurality of bits constituting the code signal FCODE are all inverted.

When the code signal RCODE is gradually reduced from the maximum value, rising of the pull-up signal Up supplied to the output buffer circuit 80 is gradually delayed and falling of the pull-down signal Down supplied to the output buffer circuit 80 is also gradually delayed as shown in FIG. 14A. As a result, rising of an output signal Out output from the data output terminal DQ is gradually delayed, so that the cross point lowers. On the other hand, when the code signal FCODE is gradually reduced from the maximum value, falling of the pull-up signal Up supplied to the output buffer circuit 80 is gradually delayed and rising of the pull-down signal Down supplied to the output buffer circuit 80 is also gradually delayed as shown in FIG. 14B. As a result, falling of the output signal Out output from the data output terminal DQ is gradually delayed, so that the cross point rises. In this way, the cross point of the output signal Out can be adjusted by the code signal RCODE or FCODE.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying modes of the disclosed invention. Thus, it is intended that the scope of at least some of the present invention herein disclosed should not be limited by the particular disclosed embodiments described above.

The invention claimed is:
1. An apparatus comprising:
a signal path including a first inverter circuit, a second inverter circuit, and a third inverter circuit;
a data serializer comprising a plurality of tristate buffer circuits and an output coupled to the signal path, wherein each of the plurality of tristate buffer signals is configured to receive a respective clock signal, and wherein one of the plurality of tristate buffer circuits is configured to output read data to a signal node in response to a rising edge of the respective clock signal;
a first signal input to the first inverter circuit; and
a second signal output from the third inverter circuit, wherein
the first inverter circuit configured to drive the first signal to a first logic level based on a code signal to provide an adjusted first signal, the first inverter circuit comprises a first adjustment circuit configured to adjust an amount of a current supplied to the first inverter circuit based on the code signal, and wherein
the second inverter circuit configured to drive the adjusted first signal to a second logic level, the second inverter circuit comprises an input node and an output node short-circuited via a resistor circuit.

2. The apparatus of claim 1, wherein the first adjustment circuit includes a plurality of transistors connected in parallel.

3. The apparatus of claim 2, wherein bits of the code signal are supplied to respective gate electrodes of the plurality of transistors.

4. The apparatus of claim 2, wherein a change speed at which the input node changes from the first logic level to the second logic level is based on a value of the code signal and a state of the plurality of transistors.

5. The apparatus of claim 4, wherein a current supply capability of the first adjustment circuit is based on the value of the code signal.

6. The apparatus of claim 1, wherein the first inverter circuit further comprises a second adjustment circuit configured to adjust the amount of current supplied to the first inverter circuit based on a second code signal.

7. The apparatus of claim 6, wherein the first inverter circuit includes a first transistor having a source connected to the first adjustment circuit and a second transistor having a source connected to the second adjustment circuit.

8. The apparatus of claim 7, wherein a level of the input node is determined by an on-resistance of a respective one of the first transistor or the second transistor, a respective one of the first adjustment circuit or the second adjustment circuit, and a ratio between an on-resistance between the second inverter circuit and a resistance value of the resistor circuit.

9. An apparatus comprising:
- a data serializer including a plurality of tristate buffer circuits and an output coupled to a signal node, the data serializer configured to convert parallel input data into serial data; and
- a plurality of inverter circuits coupled to the data serializer, the plurality of inverter circuits including a first inverter circuit, a second inverter circuit, and a third inverter circuit; and
- a plurality of output buffer circuits coupled to the serializer and configured to provide the serial data,
- wherein the first inverter circuit includes a first adjustment circuit configured to adjust an amount of a current supplied to the first inverter circuit when the first inverter circuit drives the signal node to a first logic level,
- wherein an input node and an output node of the first inverter circuit are short-circuited via a transfer gate,
- wherein the transfer gate is turned on responsive to a de-emphasis enable signal being activated, and
- wherein the de-emphasis enable signal is activated responsive to a frequency of the input data appearing on the signal node.

10. The apparatus of claim 9, further comprising a plurality of data terminals coupled to the plurality of output buffer circuits.

11. The apparatus of claim 9, wherein one of the plurality tristate buffer circuits is activated and outputs of remaining tristate buffer circuits are at a high impedance state based on a respective one of a plurality of clock signals.

12. The apparatus of claim 11, wherein the tristate buffer circuits are configured to output the input data to the signal node in response to rising edges of the plurality of clock signals, respectively.

13. The apparatus of claim 9, further comprising a transistor configured to reset the signal node to the second logic level responsive to a read enable signal being deactivated.

14. An apparatus comprising:
- a data serializer comprising a plurality of tristate buffer circuits and an output coupled to a signal node, the data serializer configured to convert parallel input data into serial data;
- a plurality of adjustment circuits included in respective ones of the plurality of tristate buffer circuits; and
- a plurality of inverter circuits comprising a first inverter circuit, a second inverter circuit, and a third inverter circuit, wherein the second and third inverter circuits are connected in series, the second inverter circuit having an input coupled to the signal node, wherein an input node and an output node of the second inverter circuit are short-circuited via a transfer gate.

15. The apparatus of claim 14, wherein a first adjustment circuit of the plurality of adjustment circuits is configured to adjust an amount of a current flowing from a power line supplied with a first power potential to the first inverter circuit based on a first code signal.

16. The apparatus of claim 15, wherein a second adjustment circuit of the plurality of adjustment circuits is configured to adjust the amount of the current flowing from the first inverter circuit to a power line supplied with a second power potential based on a second code signal.

17. The apparatus of claim 16, wherein a first signal is input to the first inverter circuit and a second signal is output from the third inverter circuit, and wherein the transfer gate is turned on in response to a de-emphasis enable signal being activated.

18. The apparatus of claim 17, wherein the de-emphasis enable signal is activated when a frequency of read data appearing on the signal node is high.

* * * * *